(12) United States Patent
Langlois

(10) Patent No.: US 7,019,601 B2
(45) Date of Patent: Mar. 28, 2006

(54) DEVICE FOR AMPLIFYING A HIGH FREQUENCY SIGNAL

(75) Inventor: Michel Langlois, Thonon les Bains (FR)

(73) Assignee: Thales, Neuilly sur Seine (FR)

( * ) Notice: Subject to any disclaimer, the term of this patent is extended or adjusted under 35 U.S.C. 154(b) by 59 days.

(21) Appl. No.: 10/483,682

(22) PCT Filed: Jul. 26, 2002

(86) PCT No.: PCT/FR02/02685

§ 371 (c)(1),
(2), (4) Date: Jan. 13, 2004

(87) PCT Pub. No.: WO03/015264

PCT Pub. Date: Feb. 20, 2003

(65) Prior Publication Data

US 2004/0169554 A1    Sep. 2, 2004

(30) Foreign Application Priority Data

Jul. 27, 2001  (FR) ................................... 01 10127

(51) Int. Cl.
*H03F 3/54* (2006.01)
(52) U.S. Cl. ..................................... 333/99 R; 330/44
(58) Field of Classification Search .................... 315/5, 315/32, 36; 330/42, 44, 22 F, 99 R
See application file for complete search history.

(56) References Cited

U.S. PATENT DOCUMENTS

| | | | |
|---|---|---|---|
| 4,514,700 A | 4/1985 | Piepers | 330/56 |
| 4,894,586 A | 1/1990 | Crager et al. | 315/39.51 |
| 5,179,264 A * | 1/1993 | Cuomo et al. | 219/121.43 |
| 5,451,794 A * | 9/1995 | McKeown et al. | 250/492.3 |
| 5,666,018 A | 9/1997 | Langlois et al. | 313/278 |
| 5,682,084 A | 10/1997 | Langlois et al. | 315/5.82 |
| 5,854,536 A | 12/1998 | Langlois et al. | 315/5 |
| 5,894,197 A | 4/1999 | Langlois | 315/5 |
| 6,870,320 B1 * | 3/2005 | Ratzinger et al. | 315/111.01 |

FOREIGN PATENT DOCUMENTS

WO    98 28845 A    7/1998

OTHER PUBLICATIONS

Smith; "Power Module Technology for the 21st Century" National Aerospace and Electronics Conference (NAECON), Dayton, May 22-26,1995, New York, IEEE, US; vol. 1, May 22, 1995, pp. 106-113; XP000550662.

* cited by examiner

*Primary Examiner*—Dean Takaoka
(74) *Attorney, Agent, or Firm*—Lowe Hauptman & Berner, LLP

(57) ABSTRACT

The present invention pertains to an amplification device for a high-frequency signal. The invention is particularly adapted for the transmission of radiofrequency signals used for television of radio under frequency modulation. The amplification device for a high-frequency signal comprises of two amplification stages arranged in series, the first amplification stage being formed of a semiconductor preamplifier, the second amplification stage being formed of an electron tube cooled by the circulation of a fluid, the electron tube being arranged inside an enclosure intended to receive it. The semiconductor preamplifier is arranged in the enclosure and the preamplifier is cooled by the circulation of the fluid. The electron tube comprises a collector needing to be cooled by the circulation of the fluid, and the fluid circulates around a cooling circuit, in which the collector is connected in parallel with the preamplifier.

11 Claims, 4 Drawing Sheets

DEVICE FOR AMPLIFYING A HIGH FREQUENCY SIGNAL

CROSS-REFERENCE TO RELATED APPLICATIONS

The present Application is based on International Application No. PCT/FR02/02685, filed on Jul. 26, 2002, entitled "AMPLIFICATION DEVICE FOR A HIGH-FREQUENCY SIGNAL", which in turn corresponds to French Application FR 01/10127 filed Jul. 27, 2001, and priority is hereby claimed under 35 USC 119 based on these applications. Each of these applications is hereby incorporated by reference in their entirety into this application.

FIELD OF THE INVENTION

The invention pertains to an amplification device for a high-frequency signal. The invention is particularly adapted for the transmission of radiofrequency signals used for television or radio under frequency modulation.

BACKGROUND OF THE INVENTION

Commonly, such devices comprise two amplification stages arranged in series. The first stage is formed of a transistor-based preamplifier and the second stage of an electron tube. For this second stage, it is possible, for example, to use an inductive output tube well known in the literature by the abbreviation IOT. The output of the electron tube is linked to the transmit antenna.

The transistor-based preamplifier is generally installed in a control rack, which rack also comprises other units for forming a radiofrequency signal, which units are situated upstream of the preamplifier in the amplification chain. These other units also use transistors. The rack is generally cooled with air pulsed by means of fans.

The electron tube is, for its part, installed in its own enclosure and it can be cooled by the circulation of a fluid in the liquid state. This fluid comprises, for example, a glycol/water mixture.

The two amplification stages, the preamplifier and the electron tube, are generally made by separate equipment manufacturers. Specifically, the technical knowledge required to devise and make each of the two stages is very different. More precisely, the transistor-based preamplifier generally uses only low voltage (of the order of some 30 volts) and operates in ambient air. In contradistinction, the electron tube uses high voltages, certain voltages may exceed some 30 kilovolts. Moreover, the amplification carried out in an electron tube uses an electron beam traveling through an evacuated enclosure.

The separation of the two amplification stages poses problems of mutual compatibility. For example, the impedance matching between the preamplifier and the electron tube can be done only when the two stages are brought together at their place of use. Another example, a radiofrequency signal, already amplified by the preamplifier, flows through the cable linking the two stages. The linking cable generates losses proportional to the power of the radiofrequency signal and to the length of the cable itself. The separation of the two stages tends to increase the length of the linking cable and, consequently, the losses generated therein.

Furthermore, each of the two stages requires an individual cooling system, thereby increasing the risk of breakdown.

An aim of the invention is to reduce the above-mentioned drawbacks by proposing that the transistor-based preamplifier and the electron tube be grouped together.

SUMMARY OF THE INVENTION

Accordingly, a subject of the invention is an amplification device for a high-frequency signal, comprising two amplification stages arranged in series, the first amplification stage being formed of a semiconductor preamplifier, the second amplification stage being formed of an electron tube cooled by the circulation of a fluid, the electron tube being arranged inside an enclosure intended to receive it, characterized in that the semiconductor preamplifier is arranged in the enclosure, in that the preamplifier is cooled by the circulation of the fluid, in that the electron tube comprises a collector needing to be cooled by the circulation of the fluid, and in that the fluid circulates around a cooling circuit, in which circuit the collector is connected in parallel with the preamplifier.

The cooling of the preamplifier carried out by means of the fluid already used for the cooling of the electron tube makes it possible to improve the reliability of the assembly. Specifically, one thus does away with a cooling system specific to the preamplifier in order to use an already existing system, in this instance the cooling system for the electron tube.

It is also important to note that cooling carried out with circulation of a liquid makes it possible to reduce the volume of the preamplifier and to improve the effectiveness of the cooling.

Still other aspects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and several details are capable of modification in various obvious respects, all without departing from the invention. Accordingly, the drawings are to be regarded as illustrative in nature, and not as restrictive.

DESCRIPTION OF THE DRAWINGS

The invention will be better understood and other advantages will become apparent on reading the detailed description of an embodiment given by way of example, which description is illustrated by the appended drawing in which.

BRIEF DESCRIPTION OF THE DRAWINGS

Figure 1:
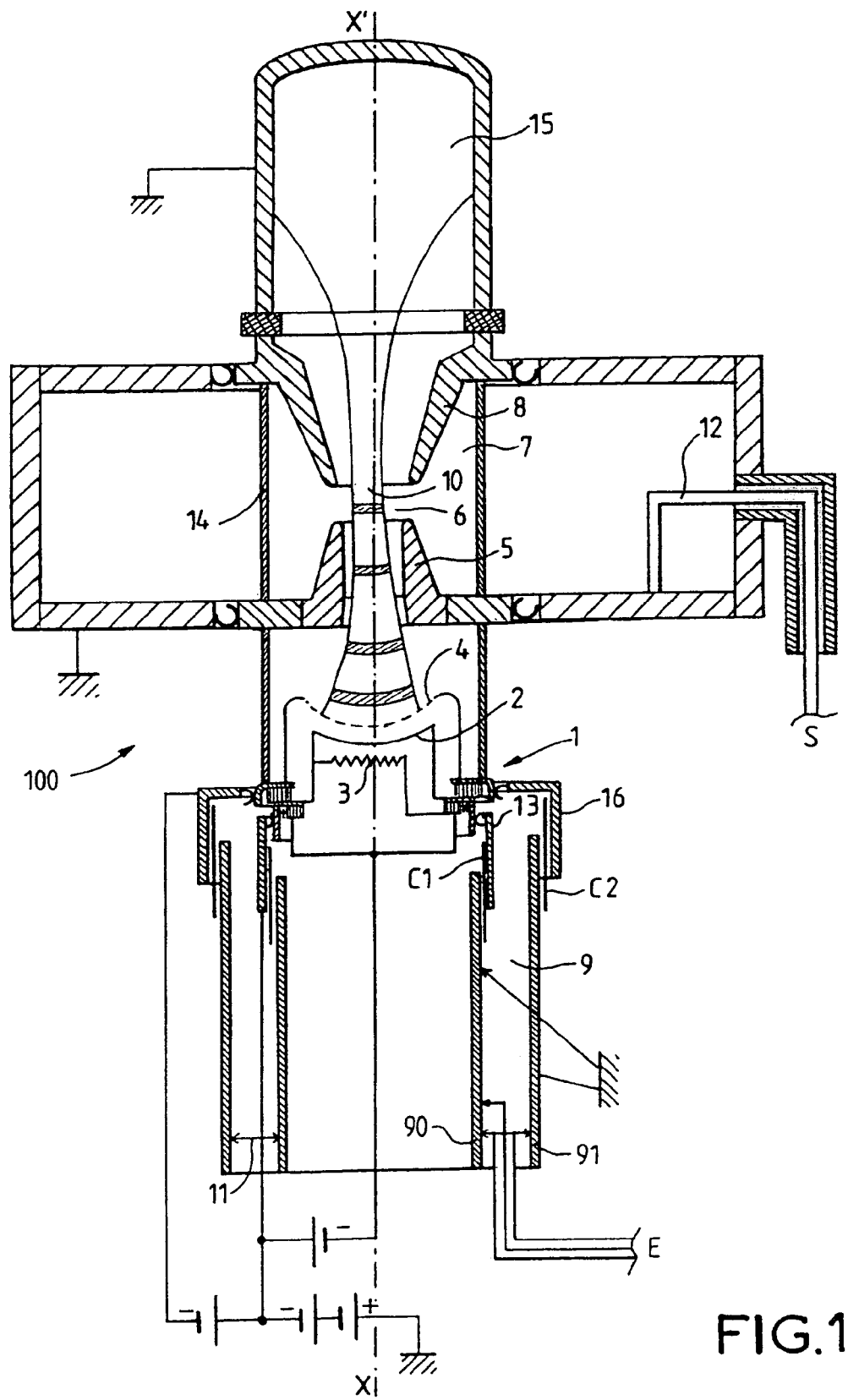
FIG. 1 represents an inductive output tube.

The electron tube 100 represented in FIG. 1 possesses an axial electron beam and uses at input the principle of amplitude modulation as in conventional grid tubes and at output the axial structure of the velocity modulation tubes as in klystrons.

More precisely, the tube comprises in succession an electron gun 1 constructed around an axis of revolution XX' and along the axis an anode 5 forming a first drift tube which opens out into an interaction space 6 of an output resonant cavity 7, the interaction space 6 being delimited by a second drift tube dubbed the interaction nozzle 8 which faces the first, then a collector 15. The two nozzles of the drift tubes are opposite one another. The gun 1 comprises a cathode 2, its heating filament 3 and a grid 4. The cathode 2/grid 4 space forms the input circuit of the tube and the input signal E is generally conveyed to the input circuit of the tube via an input coaxial resonant cavity 9 coupled to the cathode/ grid space. The input signal E to be amplified is introduced into the cavity 9 with the aid of looped inductive coupling means in the example described. This input signal E is provided by means outside the tube generally including a preamplifier (not represented in FIG. 1).

The grid 4 and the cathode 2 are raised to high negative DC voltages and the electrons emitted by the cathode emerge from the grid 4 in the form of a bunched beam 10 already density-modulated by the input signal E. The beam 10 is longitudinal with axis XX'. The electrons of the beam 10, attracted and focused by the anode 5, enter the output cavity 7 and cross the interaction space 6 where they couple with the electromagnetic field of the resonant cavity 7. From this output cavity 7 an output signal S, of much greater power than that of the input signal E, can be extracted. The electrons having yielded a large part of their energy are then gathered by the wall of the collector 15. The anode 5 is generally earthed, the collector 15 may also be earthed or be taken to a voltage slightly different from earth.

When the electron tube is intended to operate with modulated output power as in television transmitters, the input signal E carries the modulation. The input coaxial cavity 9, formed of two coaxial conducting cylinders 90, 91, is generally provided with a device 11 for adjusting its resonant frequency, for example of plunger type, the position of which is adjustable. For safety reasons and in order to decouple the preamplifier from the high voltage, this coaxial input cavity 9 is electrically earthed. A decoupling capacitor C1 ensures electrical isolation, from the DC point of view, between the inner cylinder 90 and the cathode 2 and another decoupling capacitor C2 ensures electrical isolation between the outer cylinder 91 and the modulation grid. These capacitors C1, C2 may be embodied as insulating sheets clamped respectively between a cavity cylinder 90, 91 and a cylindrical member 13, 16 connected to the respective electrode 2, 4.

In this application in the guise of transmitter in the UHF band, the high voltages are of the order of a few tens of kilovolts, the cathode being less negative than the grid.

The output signal S amplified in power with respect to the input signal E is extracted from the output cavity 7 by capacitive or self-inductive coupling. In the figure it is an inductive coupling which is represented in the form of a conductor 12 which defines a loop in the output cavity 7. It is sent to a user device such as an antenna (not represented).

The interior of the tube is conventionally evacuated. Sealing is ensured at the level of the output cavity 7 by a dielectric sleeve 14 which lets through the energy to be extracted. A part of the output cavity 7 is external. It is delimited by walls that will bear on the sleeve on the side where it is not evacuated.

The efficiency of an electron tube is of the order of 50%. More precisely, the energy contained in the output signal S is of the order of half the energy received by the electron tube 100, essentially by the contained voltage sources energizing it. The bulk of the energy dissipated by the electron tube is so at the level of the collector 15 inside which are provided channels around which a fluid circulates, allowing the cooling of the interaction nozzle 8. A smaller part of the energy is dissipated at the level of the interaction nozzle 8.

Figure 2:
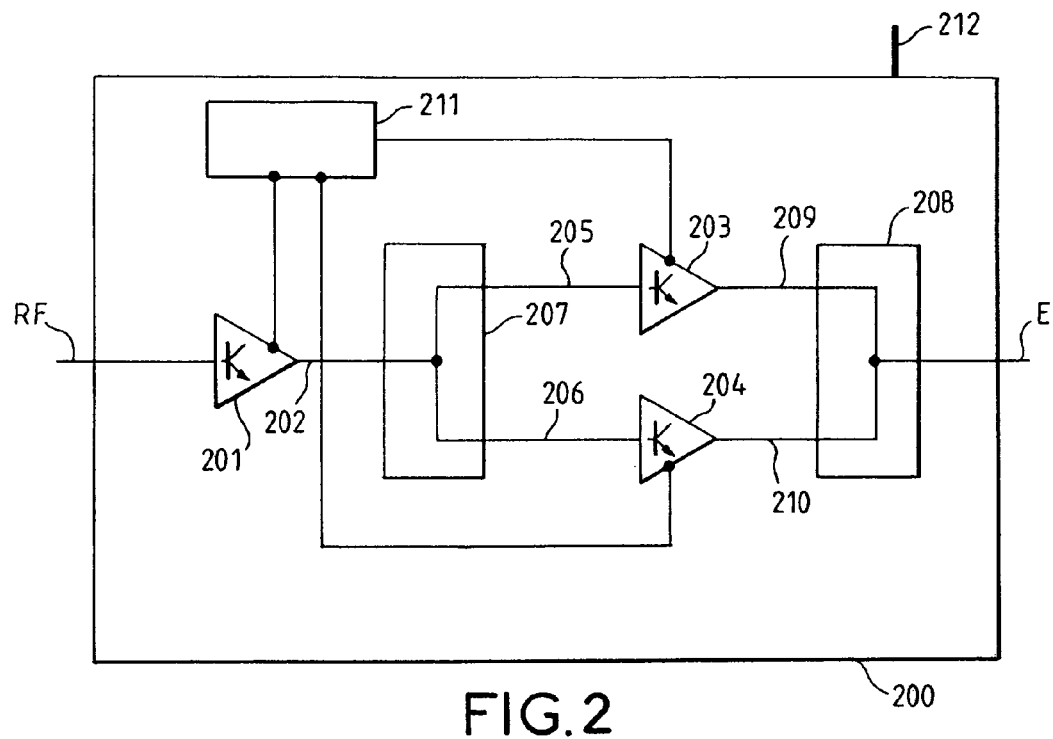
FIG. 2 represents a preamplifier.

The input signal E is delivered by a preamplifier 200 represented in FIG. 2. The preamplifier 200 for its part receives a radiofrequency signal RF emanating from units for forming the signal that are situated upstream of the preamplifier and are not represented in FIG. 2.

The preamplifier comprises a first amplification stage 201 receiving the RF signal. The output 202 of the first stage 201 is linked to the input of at least one second amplification stage. In the example represented in FIG. 2, two second stages 203 and 204 are represented. The inputs 205 and 206 of the stages 203 and 204 respectively are linked to the output 202 of the first stage 201 by way of a hybrid coupler 207. Likewise, another hybrid coupler 208 makes it possible to add together the signals present on outputs 209 and 210 of the stages 203 and 204 to form the signal E. Monitoring means 211 drive the various amplification stages 201, 203 and 204 so as to coordinate their respective function. Low-voltage energizing means (not represented) provide a voltage 212 for example 28 V for energizing the preamplifier 200. The amplification stages 201, 203 and 204 comprise transistors or more generally semiconductors that need to be cooled. This cooling is ensured by the circulation of a fluid inside channels fashioned in radiators arranged in contact with parts of the semiconductors liable to dissipate energy.

According to the invention, the preamplifier 200 is cooled with the same fluid as that used for the cooling of the electron tube 100. Advantageously, the fluid comprises water and an antifreeze product. An exemplary cooling circuit is proposed in FIG. 3. A channel 301 provides the fluid necessary for the cooling of the tube 100 and of the preamplifier 200. A channel 302 recovers all of the fluid having served for the cooling of the electron tube 100 and of the preamplifier 200. The channel 301 branches into two channels 303 and 304. Likewise, the channel 302 receives fluid originating from two channels 305 and 306. The channels 303 and 305 form the fluid supply for cooling the collector 15. The channels 304 and 306 form the fluid supply for the interaction nozzle 8 and for the preamplifier 200. In this exemplary cooling circuit, the collector 15 is connected in series with an assembly formed by the interaction nozzle 8 and the preamplifier 200, both connected in series. More precisely, the channel 304 provides the fluid directly to the interaction nozzle 8. The fluid leaves the interaction nozzle 8 through a channel 307 which provides the fluid to the preamplifier 200. The channel 306 recovers the fluid leaving the preamplifier 200.

The channel 302 provides the fluid to means for cooling and recycling the fluid. These means are not represented in the figures. Advantageously, the larger part of the fluid circulating around the cooling circuit cools the collector 15. Trials on a given rig comprising an electron tube and a preamplifier have shown that around 10% of the fluid circulating around the channels 301 and 302 is sufficient to cool the interaction nozzle 8 and the preamplifier. The remaining 90% of fluid is necessary for the cooling of the collector 15. Because only a part of the fluid is circulated around the interaction nozzle 8 and around the preamplifier 200 it is possible to optimize the head losses in the cooling circuit.

Figure 3:
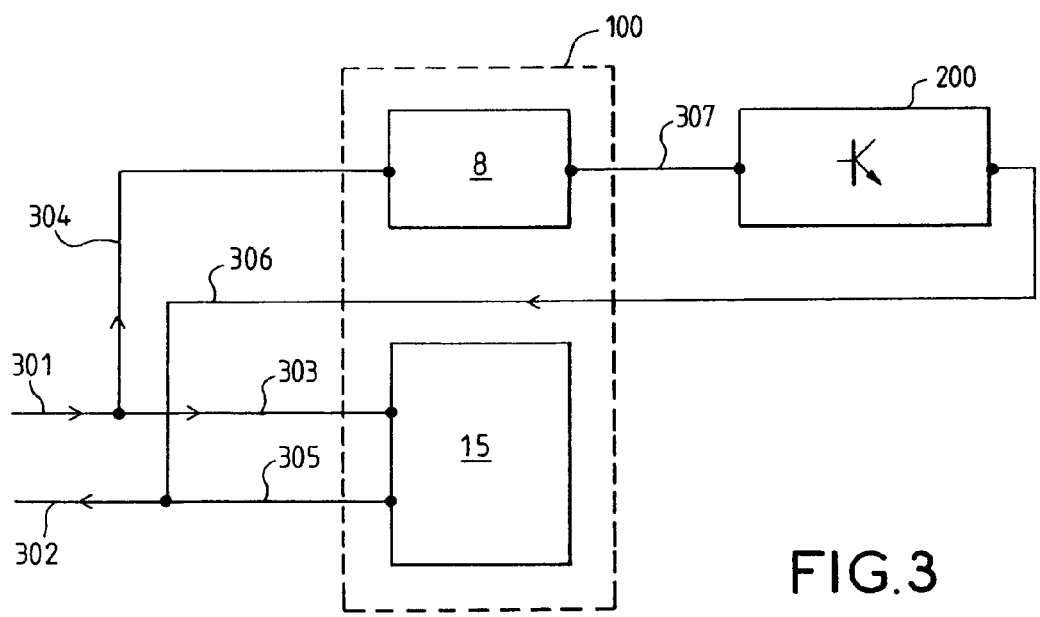
FIG. 3 represents, in block diagram form, an exemplary cooling circuit.
Figure 4:
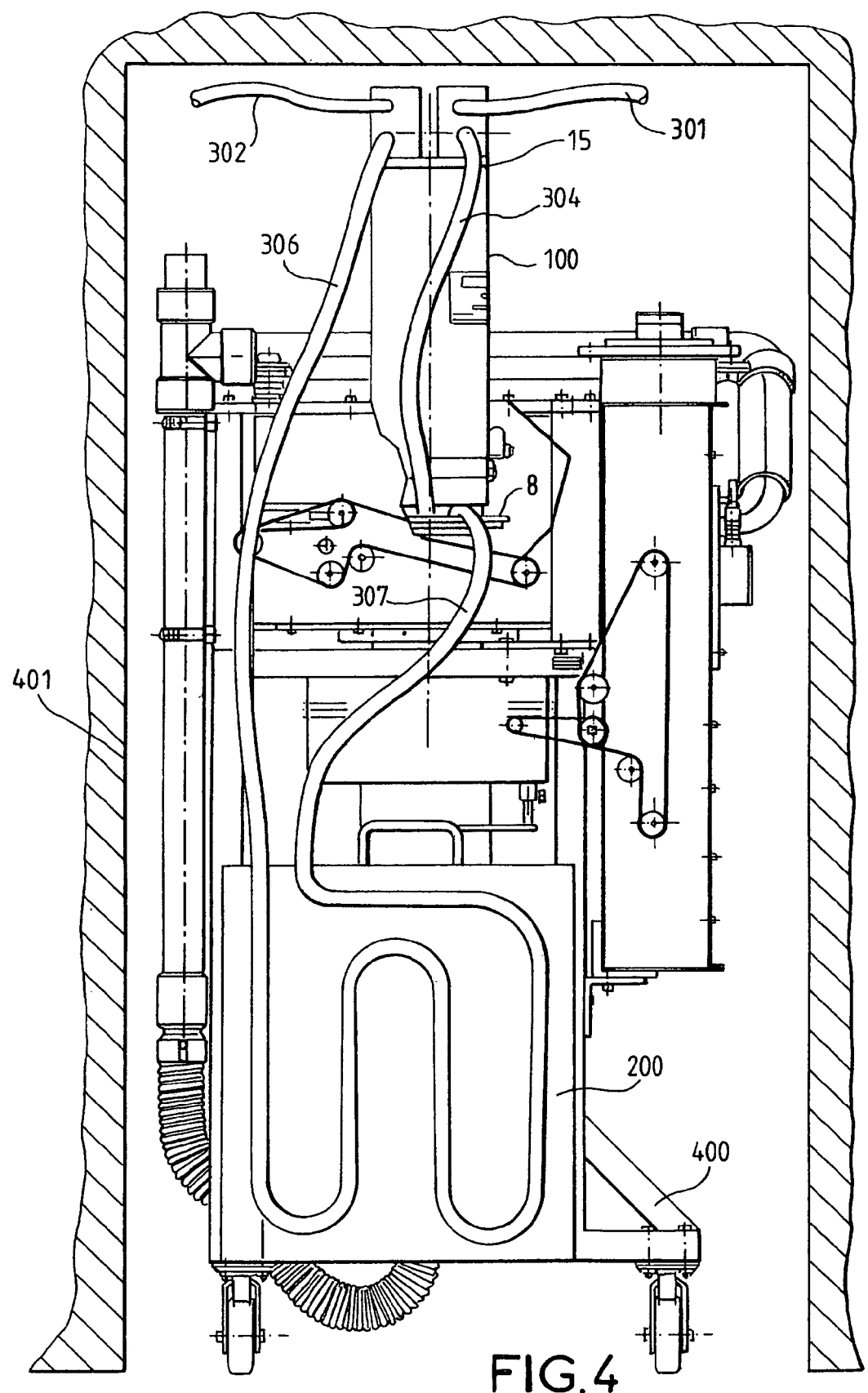
FIG. 4 represents, to scale, the cooling circuit of FIG. 3.

FIG. 4 repeats the various elements of FIG. 3, namely the electron tube 100, the preamplifier 200, the channels 301 to 307. These elements are, in the example represented, mounted on a support with castors 400. The support with castors 400 and the elements mounted thereon may thus be arranged inside an enclosure 401 which, in the prior art, was reserved solely for the electron tube 100.

The presence of the preamplifier 200, in proximity to the electron tube 100, here underneath, necessitates a particular screening of the preamplifier 200 in order to prevent it being disturbed by electromagnetic radiation emitted by the electron tube 100. This screening tends to increase the cost of the preamplifier 100.

Figure 5:
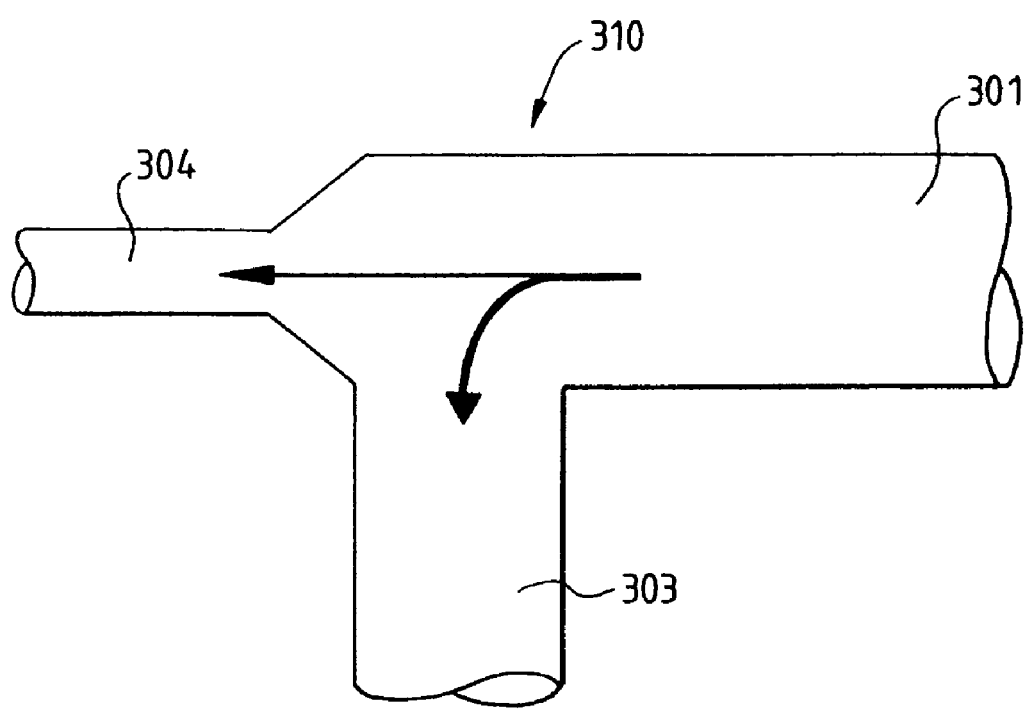
FIG. 5 represents an input branch of the cooling circuit.

Advantageously, as represented in FIG. 5, the cooling circuit comprises an input branch 310 to which is connected the channel 301 conducting all of the fluid circulating around the cooling circuit, the channel 303 conducting the larger part of the fluid to the collector 15 and the channel 304 conducting a small part of the fluid to the preamplifier 200. In the input branch 310, the channel 304 faces the channel 301. Thus, the kinetic energy available in the fluid circulating around the channel 301 is used to supply the preamplifier 200 and there is no need to provide means for aiding circulation of the fluid in the preamplifier 200 for example by means of a circulation pump. The adjusting of the share of the total flow rate of the fluid is done by adapting the head losses in the various parts of the cooling circuit in particular by adapting the sections of the various cooling circuit channels.

It will be readily seen by one of ordinary skill in the art that embodiments according to the present invention fulfill many of the advantages set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

What is claimed is:

1. An amplification device for a high-frequency signal, comprising:
    two amplification stages arranged in series, the first amplification stage being formed of a semiconductor preamplifier, the second amplification stage being formed of an electron tube cooled by the circulation of a fluid, the electron tube being arranged inside an enclosure intended to receive it;
    wherein the semiconductor preamplifier is arranged in the enclosure, in that the preamplifier is cooled by the circulation of the fluid;
    the electron tube comprises a collector needing to be cooled by the circulation of the fluid;
    the fluid circulates around a cooling circuit, in which circuit the collector is connected in parallel with the preamplifier.

2. The amplification device as claimed in claim 1, wherein the electron tube comprises an interaction nozzle needing to be cooled by the circulation of the fluid, wherein the fluid circulates in parallel around the collector and around an assembly formed by the interaction nozzle and the preamplifier, the latter two being connected in series.

3. The amplification device as claimed in claim 1, wherein the fluid comprises water and an antifreeze product.

4. The amplification device as claimed in claim 1, wherein a larger part of the fluid circulating around the cooling circuit cools the collector.

5. The amplification device as claimed in claim 1, wherein the cooling circuit comprises an input branch to which is connected a first input channel conducting all of the fluid circulating around the cooling circuit, a second channel conducting the larger part of the fluid to the collector and a third channel conducting a small part of the fluid to the preamplifier, and the input branch, the third channel faces the first channel.

6. The amplification device as claimed in claim 2, wherein the fluid comprises water and an antifreeze product.

7. The amplification device as claimed in claim 2, wherein a larger part of the fluid circulating around the cooling circuit cools the collector.

8. The amplification device as claimed in claim 3, wherein a larger part of the fluid circulating around the cooling circuit cools the collector.

9. The amplification device as claimed in claim 2, wherein the cooling circuit comprises an input branch to which is connected a first input channel conducting all of the fluid circulating around the cooling circuit, a second channel conducting the larger part of the fluid to the collector and a third channel conducting a small part of the fluid to the preamplifier, and the input branch, the third channel faces the first channel.

10. The amplification device as claimed in claim 3, wherein the cooling circuit comprises an input branch to which is connected a first input channel conducting all of the fluid circulating around the cooling circuit, a second channel conducting the larger part of the fluid to the collector and a third channel conducting a small part of the fluid to the preamplifier, and the input branch, the third channel faces the first channel.

11. The amplification device as claimed in claim 4, wherein the cooling circuit comprises an input branch to which is connected a first input channel conducting all of the fluid circulating around the cooling circuit, a second channel conducting the larger part of the fluid to the collector and a third channel conducting a small part of the fluid to the preamplifier, and the input branch, the third channel faces the first channel.

* * * * *